United States Patent
Mochida

(10) Patent No.: US 7,623,402 B2
(45) Date of Patent: Nov. 24, 2009

(54) SEMICONDUCTOR MEMORY DEVICE OPERATING A SELF REFRESHING AND AN AUTO REFRESHING

(75) Inventor: Yoshifumi Mochida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 133 days.

(21) Appl. No.: 11/965,102

(22) Filed: Dec. 27, 2007

(65) Prior Publication Data

US 2008/0159040 A1  Jul. 3, 2008

(30) Foreign Application Priority Data

Dec. 27, 2006  (JP) .............................. 2006-351296

(51) Int. Cl.
  *G11C 7/00* (2006.01)
(52) U.S. Cl. .................................. 365/222; 365/185.25
(58) Field of Classification Search .................. 365/222
  See application file for complete search history.

(56) References Cited

U.S. PATENT DOCUMENTS 6,366,515 B2 *  4/2002  Hidaka ........................ 365/200

2002/0097626 A1 *  7/2002  Hidaka ........................ 365/222

FOREIGN PATENT DOCUMENTS

| JP | 05-047175 | * | 2/1993 |
| JP | 05-047175 A | | 2/1993 |
| JP | 07-078468 A | | 3/1995 |
| JP | 08-087883 | * | 4/1996 |
| JP | 08-087883 A | | 4/1996 |
| JP | 2001-283586 A | | 10/2001 |

* cited by examiner

*Primary Examiner*—Amir Zarabian
*Assistant Examiner*—Anthan T Tran
(74) *Attorney, Agent, or Firm*—Sughrue Mion, PLLC

(57) ABSTRACT

An oscillating period of an oscillator is configured to be adjustable by CODEi output from a ROM circuit, and a circuit is configured so that the oscillating period is equal to a period p times a tRAS period during self refreshing. An n-bit counter counts up based on the output of the oscillator. A programmable decoder issues a reset to the n-bit counter in a period equal to q times the oscillating period based on a count of the n-bit counter and CODEj output from the ROM circuit. Each time the programmable decoder issues the reset, an RASB signal is activated by controlling SRACT at H-level for a period equal to 1/p times the period of OSC0.

24 Claims, 10 Drawing Sheets though the tRAS periods of the auto refreshing and the self refreshing are set at the same time length. In this case, there has been a problem that the tRAS period that provides a rewrite period of a memory cell is excessively short and a restoring level is insufficient in the self refreshing.

SEMICONDUCTOR MEMORY DEVICE OPERATING A SELF REFRESHING AND AN AUTO REFRESHING

This application is based upon and claims the benefit of priority from Japanese patent application No. 2006-351296, the disclosure of which is incorporated herein in its entirety by reference.

BACKGROUND OF THE INVENTION

1. Field of the Invention

The present invention relates to a semiconductor memory device, and more specifically, to a semiconductor memory device having a dynamic memory cell requiring a refresh operation in order to retain data therein.

2. Description of the Related Art

A semiconductor memory device (DRAM) using a dynamic memory cell as a storage element performs a refresh operation periodically, because the memory cell loses stored data as time elapses. When a synchronous dynamic RAM (SDRAM) is taken as an example, there are refresh operations executed in accordance with an external command (auto refreshing) and refresh operation periodically executed at a timing generated internally (self refreshing). The auto refreshing is executed in accordance with an input command in a state where the DRAM is activated. In the auto refreshing, the refresh operation is inserted between a write operation and a read operation, and thus a higher speed is required for the refresh operation. The self refreshing is performed at a timing generated inside the DRAM in a stand-by mode. In the self refreshing, write and read operations are not performed, and only the refresh operation is performed in periodical intervals.

In the auto refreshing, when a refresh command is input, a certain row address is selected, and the refresh operation is executed. At this stage, with respect to the row address, an address needs not be designated from the outside since a refresh counter provided in the internal of the DRAM automatically generates a refresh address. In order to retain data, the auto refreshing needs to be executed for a number of times corresponding to the number of row addresses within a specified time of the refresh period. For example, in case of 8192/64 ms, the auto refreshing is necessary for 8192 times within 64 ms. When the auto refreshing ends, the DRAM automatically returns to an idle mode.

The self refreshing is carried out in the mode where power consumption of the device is controlled to a lower value by deactivating the clock and allowing the device to assume a stand-by mode. The self refreshing is automatically carried out in the internal of the DRAM based on a timing of the refresh operation, the timing being generated by using the refresh counter in the DRAM.

In the auto refreshing, it is sufficient to satisfy the data retention time. A tRAS period (tRAS=Active to precharge command period: activated period of a cell array for access) during the auto refreshing is specified by tRASmin as a specification. On the other hand, during the self refreshing, there is a case where the data retention time equal to or longer than the tRASmin specified in the specification is needed by extending the refresh period due to the necessity to control the average current to a lower value. For this reason, the auto refreshing and the self refreshing are desired to have different time lengths for the tRAS period. However, in a related technique for the semiconductor device, since a signal (RASB signal) for activating the DRAM array is generated in the same signal path during the auto refreshing and during the self refreshing, there has been a case where the tRAS periods of the auto refreshing and the self refreshing are set at the same time length. In this case, there has been a problem that the tRAS period that provides a rewrite period of a memory cell is excessively short and a restoring level is insufficient in the self refreshing.

A technique that resolves the above problem is described in Patent Publication JP-2001-283586-A. FIG. 9 shows the circuit configuration of a section for generating an RASB signal in the semiconductor memory device described in JP-2001-283586-A. A NOR gate 201 and a NOR gate 202 in combination configures a set-reset flip-flop. RF_cmd signal for instructing a refresh operation is input to one of two inputs to the NOR gate 201. When the RF_cmd rises to H-level to instruct the refresh operation, the output RASB of the NOR gate 201 falls to L-level and the RASB signal is activated.

RTO signal is used for deactivation of the activated RASB signal. The RTO is input to one of two inputs of the NOR gate 202 configuring the flip-flop. Signal paths of the RTO include two paths, i.e., a signal path (signal path A) passing through a transistor 204 and a signal path (signal path B) passing through a transistor 205 and a delay gate 206. A signal obtained by inverting, in an inverter 203, a SR_EN signal showing whether or not the refresh operation is the self refreshing is input to a gate of the transistor 204, and the SR_EN signal is input in a gate of the transistor 205. During the auto refreshing, the transistor 204 is turned ON to select the signal path A. During the self refreshing, the transistor 205 is turned ON to select the signal path B.

FIG. 10 shows the circuit configuration of a part in relation to generation of the RTO node used in the RASB control circuit 200 shown in FIG. 9. A NAND gate 213 outputs NAND of a signal obtained by inverting the RASB signal in an inverter 211 and a signal obtained by delaying the output of the inverter 211 in a delay gate 212 by a delay time td_rto. An inverter 214 inverts the output of the NAND gate 213 and outputs the inverted output as the RTO node. After the RASB signal falls from H-level to L-level, the RTO node rises from L-level to H-level at a time instant delayed by the delay time td_rto of the delay gate 212 from the timing of fall of the RASB signal. In addition, the RTO node falls to L-level in accordance with a rise of the RASB signal from L-level to H-level.

FIG. 11 shows a timing chart showing the waveform of each part of the circuit shown in FIG. 9. The SR_EN signal is fixed to L-level for a period when the auto refreshing is executed. In the RASB control circuit 200, only the transistor 204 is turned ON out of the transistors 204 and 205 shown in FIG. 9, and the signal path A is selected as a signal path to the RTO node. The RASB signal is deactivated (H-level) at the beginning. When a one-shot pulse is applied to the RF_cmd, the output of the NOR gate 201, that is, the RASB signal, falls from H-level to L-level, and the RASB signal is activated.

When the RASB signal falls from H-level to L-level, one of inputs of the NAND gate 213 (FIG. 10) of the RTO generation section immediately rises to H-level, and the other input rises to H-level after the lapse of the delay time td_rto of the delay gate 212. When both of the inputs of the NAND gate 213 become H-level, the RTO node rises from L-level to H-level. The input PRE node of the NOR gate 202 is connected to the RTO node via the transistor 204, the level thereof rises from L-level to H-level in accordance with a level change of the RTO node.

When the RTO node (PRE node) rises to H-level, the output of the NOR gate 202 falls to L-level. In this manner, both inputs of the NOR gate 201 assume L-level, and the RASB signal rises from L-level to H-level. When the RASB signal rises to H-level, the output of the NAND gate 213 (FIG. 10) rises to H-level, and the RTO node falls to L-level. During the auto refreshing, a rising edge of the RTO node and a rising edge in the PRE node temporarily coincide with each other, and the tRAS is defined by a period from a falling edge of the RASB signal to the rising edge of the RTO (the rising edge of the RASB signal subsequent thereto).

On the other hand, in the period of executing the self refreshing, the SR_EN signal is fixed at H-level. By the SR_EN signal being fixed at H-level, only the transistor 205 is turned ON out of the transistors 204 and 205, and the signal path B is selected as the signal path to the RTO node. The RASB signal falls to L-level by a one-shot pulse in the RF_cmd, and thereafter the RTO node rises to H-level at a time instant delayed by the delay time td_rto of the delay gate 212. Operation up to this stage is the same as the operation during the auto refreshing.

During the self refreshing, since the signal path B is selected as a signal path to the input of the NOR gate 202, the PRE node rises to H-level at a time instant delayed by the delay time td of the delay gate 206 after the RTO rises to H-level. As the PRE node rises to H-level, the RASB signal rises to H-level, and thereafter, the RTO node falls to L-level. During the self refreshing, a signal change of the input PRE node is delayed by the delay time td from the signal change of the RTO node, and the tRAS is defined by a period from a falling edge of the RASB signal to a rising edge of the RASB signal driven by the rise of the PRE node.

The tRAS period (tRAS_sr) during the self refreshing is longer than the tRAS period (tRAS_ref) during the auto refreshing by the delay time td of the delay gate 206. For this reason, during the self refreshing, an L-level period (activated period) of the RASB signal is longer by the delay time td, and the selected period of a word line is extended. In this manner, a tRAS period corresponding to length of a cycle of the refreshing can be obtained during the auto refreshing and during the self refreshing, and appropriate driving time and restoring level can be obtained in both the auto refreshing and the self refreshing.

In the conventional semiconductor memory device, a delay gate is used, and a tRAS period is specified by the delay time of the delay gate. The delay time of the delay gate is easily affected by the ambient temperature and a process fluctuation, and there is a problem in that the tRAS period is difficult to control at an appropriate value. In addition, the generation circuit for the RASB signal is normally allocated in the vicinity of a memory cell, and is necessary for each bank. The enable signal (SR_EN signal) of the self refreshing for switching a signal path to RTO node needs to be allocated to a generation part of the RASB signal, and there is a problem in that the signal path is complicated due to increase in the number of wires. In addition, there is also a problem in that the circuit scale is increased due to provision of the delay gate.

SUMMARY OF THE INVENTION

It is an object of the present invention to provide a semiconductor memory device that can solve the above problems of the conventional semiconductor memory device, and achieve an activated period of a cell array in accordance with types of the refresh operation without causing an increase in the number of wires and the circuit scale.

It is another object of the present invention to provide a semiconductor memory device which is capable of controlling the activated period of the cell array at a desired period.

The present invention provides a semiconductor memory device that executes a first refreshing executed in accordance with an external command and a second refreshing executed periodically in a timing generated in the semiconductor memory device. The semiconductor memory devices includes an oscillator that oscillates at an oscillating period which is p times (p: a positive integer or a reciprocal of a positive integer) as long as an activated period (referred to as tRAS period hereinafter) of a cell array for access in the second refreshing, and outputs a periodic signal including a plurality of cycles of the oscillating period, wherein: the second refreshing is executed by activating the cell array for a period equal to 1/p times a first period specified by a number of cycles in the periodic signal, and a period equal to the first period multiplied by q (q: a positive integer) is selected as a refresh period of the second refreshing.

The above and other objects, features and advantages of the present invention will be more apparent from the following description, referring to the accompanying drawings.

DETAILED DESCRIPTION OF THE EMBODIMENTS

Figure 1:
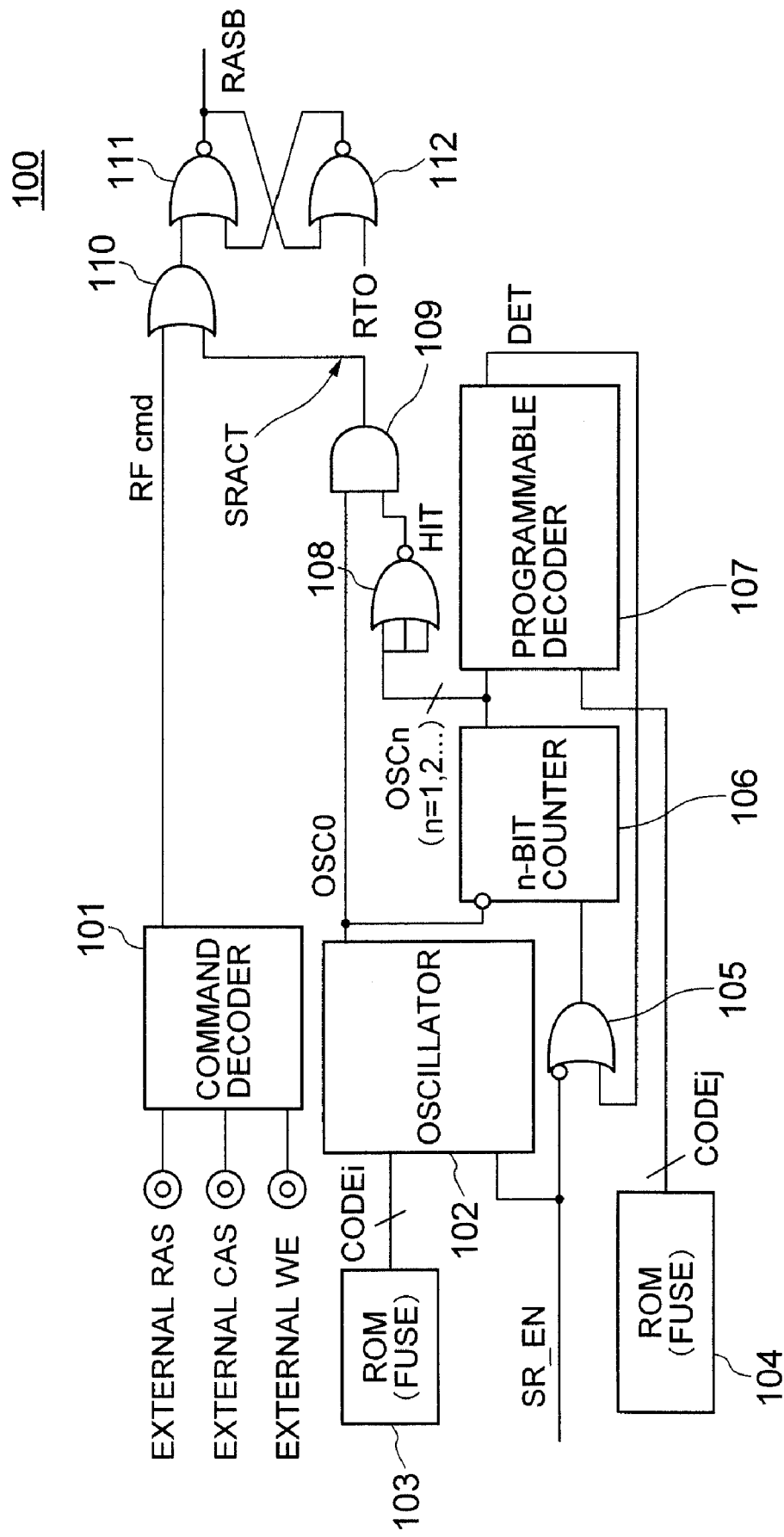
FIG. 1 is a circuit block diagram showing the configuration of a section for generating an RASB signal in a semiconductor memory device according to a first embodiment of the present invention.

Now, exemplary embodiments of the present invention will be described with reference to accompanying drawings, wherein similar constituent elements are designated by similar reference numerals throughout the drawings.

FIG. 1 shows the circuit configuration of a section for generating an RASB signal in a semiconductor memory device according to a first embodiment of the present invention. As the refresh operation executed in the semiconductor memory device, auto refreshing (first refreshing) and self refreshing (second refreshing) are considered. An RASB control circuit 100 includes a command decoder 101, an oscillator 102, ROM circuits 103 and 104, OR gates 105 and 110, an n-bit counter 106, a programmable decoder 107, NOR gates 108, 111, and 112, and an AND gate 109. The command decoder 101 decodes a command input from an external terminal, such as RAS or CAS terminal, and generates an RF_cmd signal for executing the refresh operation during the auto refreshing.

The oscillator 102 starts oscillating operation based on SR_EN signal, and oscillates at a predetermined oscillating period. This oscillating period of the oscillator 102 can be adjusted by CODEi signal having a predetermined number of bits output from the ROM circuit 103. The ROM circuit 103 is configured by a FUSE circuit, for example. The ROM circuit 103 has a number of fuses corresponding to the number of bits of the output CODEi signal, and each of the fuses is arranged between the power source line and the output node. During the fuse-cutting, a fuse corresponding to a bit "0" is cut, and a fuse corresponding to a bit "1" is left uncut. On the reference side, each bit is determined by existence or nonexistence of a voltage, to read out the CODEi signal.

In general, the oscillator is configured by inverters arranged in the odd number of stages. A transistor for adjusting the magnitude of current is inserted between the transistor configuring each inverter and the power source line, whereby the current driveability of each inverter is adjusted. Therefore, the speed of signal transmission from a preceding stage to a succeeding stage can be adjusted. As a result, the oscillating period can be adjusted. The oscillator 102, for example, decodes the CODEi, determines the voltage applied to the gate of the transistor for adjusting the magnitude of current in accordance with the numerical value of the decoded CODEi, and sets the oscillating period to a period corresponding to the CODEi. For example, a larger value of the CODEi corresponds to a larger current driveability of the inverter, which reduces the length of the oscillating period.

During manufacture of the semiconductor memory device, the oscillating period of the oscillator 102 is measured, for example, by a wafer test, and fuse-cutting of the ROM circuit 103 is performed so as to set the oscillating period at a desired period. By adjusting the oscillating period in this manner, even if the oscillating period of the oscillator 102 varies under the influence from a process fluctuation, the oscillating period can be accurately adjusted to a desired period.

In the adjustment of the oscillating period described above, the oscillating period of the oscillator 102 is set based on an activated period (tRAS period) of a cell array during the self refreshing. More specifically, the oscillating period of the oscillator 102 is set to p times the designed value of the tRAS period during the self refreshing, where the value of p is a predetermined number (positive integer). The value of p is determined by the circuit configuration of a logical circuit for generating the tRAS period from the output of the oscillator 102 during the self refreshing. For example, in the circuit configuration where the output OSC0 of the oscillator 102 has the duty ratio of 50% and an H-level period of the OSC0 is used as the tRAS period, p=2 is obtained. In the case of this configuration, the oscillating period of the oscillator 102 is adjusted to double the desired tRAS period.

The n-bit counter 106 counts up based on the signal OSC0 having a predetermined period and output from the oscillator 102, and outputs counted values (OSC1 to OSCn) of n bits. The programmable decoder 107 is equivalent to a reset-condition determination circuit that generates a reset signal with respect to the n-bit counter 106. The programmable decoder 107 compares data of n bits configured by OSC1 to OSCn output from the n-bit counter 106 and CODEj of the predetermined number of bits output from the ROM circuit 104, and issues a reset signal based on a result of the comparison. The ROM circuit 104 is configured that the output CODEj can be changed based on a pattern of the FUSE cutting, similar to the ROM circuit 103.

The programmable decoder 107 decodes each of data of n bits output from the n-bit counter 106 and the CODEj output from the ROM circuit 104 and compares the data and the CODEj. When the data and the CODEj match with each other, the decoder 107 sets an output DET to H-level and issues a reset signal. The DET output from the programmable decoder 107 is input to one of two inputs of the OR gate 105. An inverted signal of the SR_EN signal is input to the other input of the OR gate 105. The output of the OR gate 105 is input to a reset terminal of the n-bit counter 106. Before the start of operation of the n-bit counter 106, the DET signal output from the programmable decoder 107 assumes L-level. When the SR_EN signal rises to H-level, the n-bit counter 106 releases the reset mode and starts the operation. After the operation is started, the counter 106 resets a count to 0 when the programmable decoder 107 issues a reset and changes the output DET signal to H-level.

The NOR gate 108 receives the output (OSC1 to OSCn) of the n-bit counter 106, and outputs NOR of the OSC1 to OSCn. The NOR gate 108 outputs "1" (H-level) when all of the OSC1 to OSCn are "0" (L-level). The AND gate 109 outputs AND of the output of the NOR gate 108 and the OSC0 output of the oscillator 102. Output SRACT of the AND gate 109 rises to H-level when the OSC0 assumes H-level and all of the OSC1 to OSCn are L-level. When at least one of the OSC1 to OSCn assumes H-level, the output SRACT assumes L-level.

The OR gate 110 outputs OR of the RF_cmd output from the command decoder 101 and the SRACT output from the AND gate 109. A NOR gate 111 and the NOR gate 112 in combination configure a set-reset flip-flop. One of two inputs of the NOR gate 111 receives the output of an OR gate 110, and the other receives the output of the NOR gate 112. In addition, one of the inputs of the NOR gate 112 receives the output of the NOR gate 111 and the other receives the RTO signal. The RTO signal can be generated in the circuit shown in FIG. 10 in a typical manner. The RTO signal rises to H-level after the lapse of a predetermined time length from the falling edge of the RASB signal, and falls to L-level after a rise of the RASB signal.

During the auto refreshing, the SR_EN signal is controlled at L-level, and the oscillator is stopped. Therefore, during the auto refreshing, the signal level of the SRACT is not changed from L-level, and the output of the OR gate 110 changes depending on the RF_cmd. On the other hand, during the self refreshing, the semiconductor memory device stops the clock and assumes a deactivated mode. Therefore, a refresh command is not input to the command decoder 101. As a result, the RF_cmd signal does not rise from L-level, and the output of the OR gate 110 changes depending on the SRACT signal.

During the self refreshing, the programmable decoder 107 periodically sets the DET to H-level to reset the n-bit counter 106, whereby the SRACT signal periodically rises to H-level. The periodical rise of the SRACT signal to H-level allows the self refreshing to be operated periodically. The refresh period (refresh cycle period) of the self refreshing at this stage is determined by the period issued by the programmable decoder 107. The programmable decoder 107 compares data (OSC1 to OSCn) output from the n-bit counter 106 and the CODEj output from the ROM circuit 104 to raise the DET signal to H-level. Therefore, the refresh period is determined by the oscillating period of the oscillator 102 and the CODEj. More specifically, the refresh period during the self refreshing is set to an integer multiple (q times: q is a positive integer) of the oscillating period of the oscillator 102, depending on a value of the CODEj.

Figure 2:
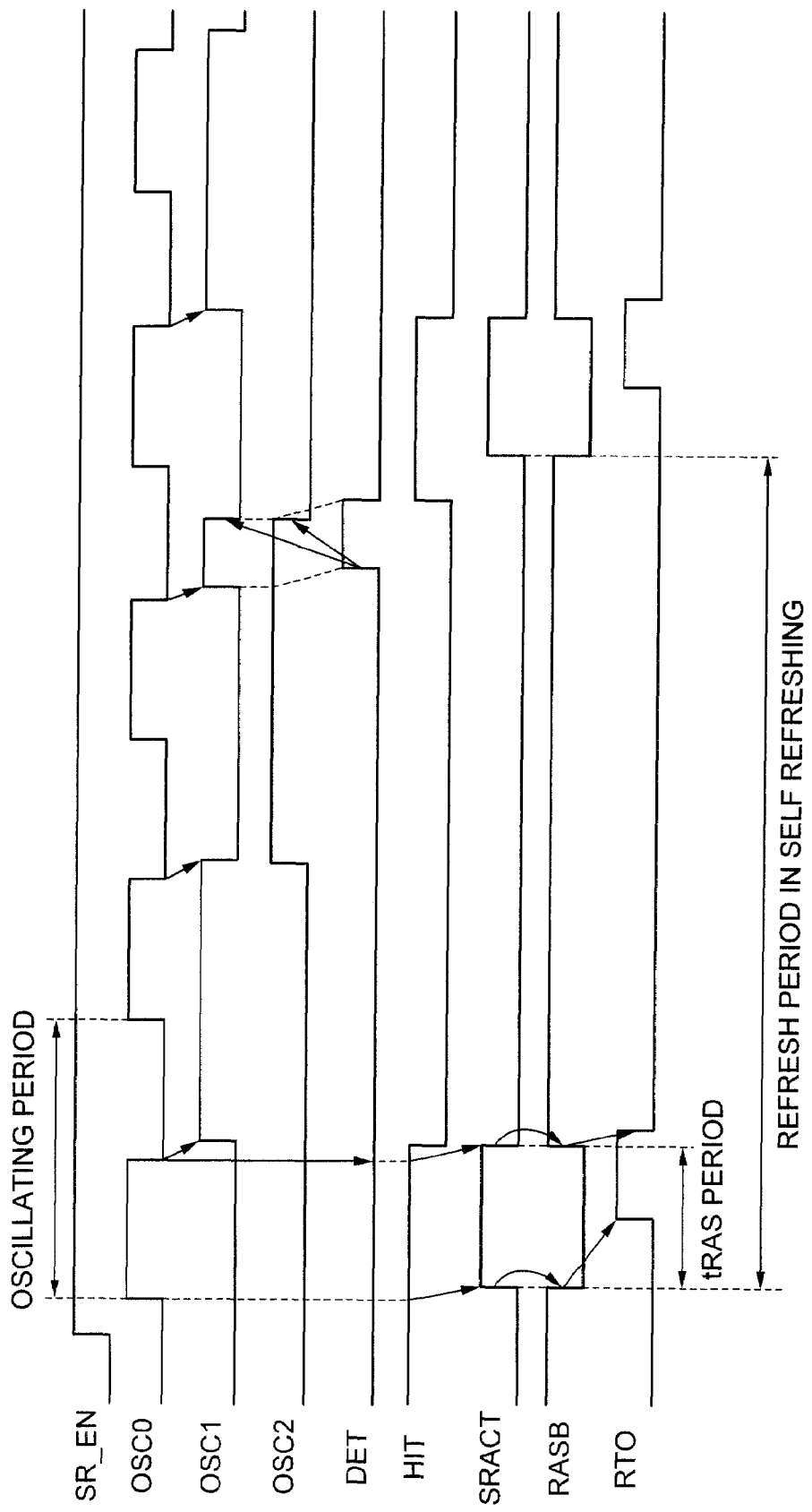
FIG. 2 is a timing chart showing a timing chart showing a waveform of each part of the RASB control circuit shown in FIG. 1 during the self refreshing.

FIG. 2 shows the waveform of each part of the RASB control circuit 100 during the self refreshing. In this example, the oscillating period of the oscillator 102 is set to double the tRAS period during the self refreshing by the CODEi output from the ROM circuit 103. That is, p=2. The duty ratio of the output OSC0 of the oscillator 102 is set to 50%. It is assumed here that the number of bits of the n-bit counter 106 is set to 2 bits, and the CODEj output from the ROM circuit 104 is set to "11". By setting the value of the CODEj to the value corresponding to "3" represented by the decimal number system, the period of the self refreshing is set to triple the oscillating period of the oscillator 102. That is, q=3.

Figure 10:
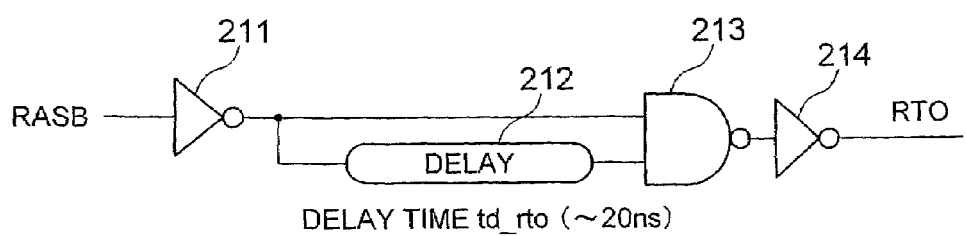
FIG. 10 is a circuit diagram showing the circuit configuration of a section for generating an RTO signal used in an RASB control circuit shown in FIG. 9.
Figure 11:
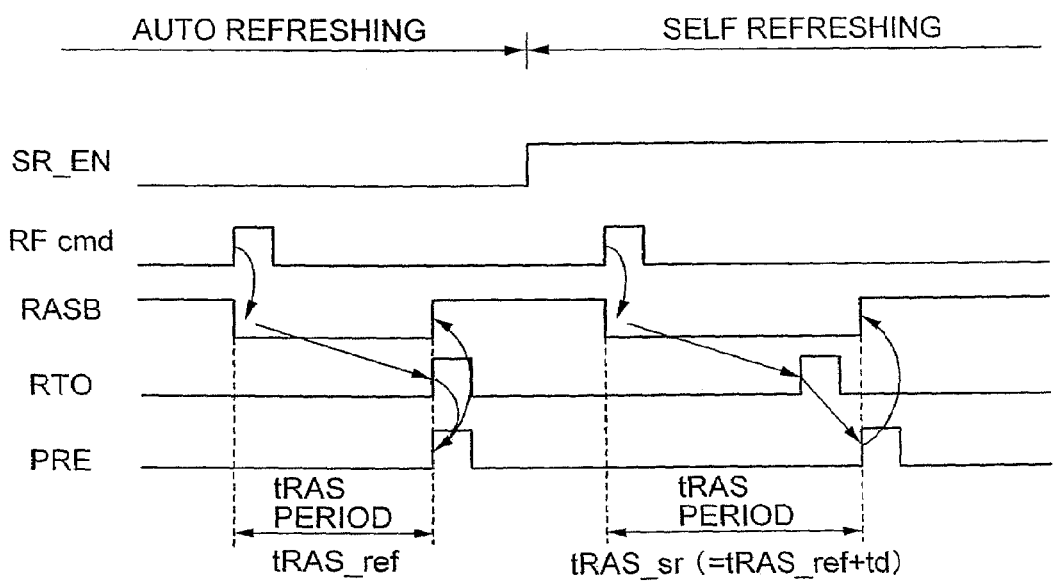
FIG. 11 is a timing chart showing the waveform of each part of the conventional RASB control circuit shown in FIG. 9.

Operation during the auto refreshing is similar to that in an L-level period of the SR_EN signal in FIG. 11. That is, the command decoder 101 generates a one-shot pulse in the RF_cmd in accordance with input of the refresh command, thereby lowering the RASB signal to L-level. Thereafter, the RTO generation circuit (FIG. 10) changes the RTO from L-level to H-level after the lapse of a predetermined time length from the falling edge of the RASB signal, thereby raising the RASB signal to H-level. The tRAS period during the auto refreshing is determined by the delay time of a delay gate 212 of the RTO generation circuit.

During transition to the self refreshing, the SR_EN signal rises from L-level to H-level, and thereafter, the SR_EN signal is fixed at H-level. The oscillator 102 starts operation as the SR_EN signal rises from L-level to H-level, and outputs the OSC0 of the oscillating period based on the CODEi. In addition, when the SR_EN signal rises to H-level, reset of the n-bit counter 106 is released, and the n-bit counter 106 starts count up.

When the oscillator 102 starts operation, the OSC0 rises to H-level. At this stage, the count of the n-bit counter 106 is 0 (OSC1=0, OSC2=0), and HIT output from the NOR gate 108 assumes H-level. Therefore, when the OSC0 rises to H-level, the SRACT output from the AND gate 109 rises to H-level in accordance thereto. Then, H-level is input to one of the inputs of the NOR gate 111 configuring a flip-flop, and the RASB signal falls to L-level.

When the RASB signal falls to L-level, the RTO rises to H-level after the lapse of the delay time of the delay gate 212 (FIG. 10) from the falling edge of the RASB signal. When the RTO rises to H-level, the output of the NOR gate 112, that is, the other of the inputs of the NOR gate 111, falls to L-level. At this stage, since the output of the OR gate 110 input to the NOR gate 111, that is, the SRACT signal, remains at H-level, the RASB signal output from the NOR gate 111 is maintained at L-level.

When the output OSC0 of the oscillator 102 falls from H-level to L-level, the output SRACT of the AND gate 109 falls to L-level in accordance thereto. Thereby, both of the two inputs of the NOR gate 111 assumes L-level, and therefore the RASB signal rises to H-level. An L-level period of the RASB signal determines the tRAS period during the self refreshing, and the tRAS period matches with an H-level period of the OSC0, that is, half the oscillating period of the oscillator 102. The RTO signal falls to L-level when the RASB signal falls to H-level (refer to FIG. 10).

When the H-level period of the OSC0 ends, and the OSC0 falls to L-level, the n-bit counter 106 detects the falling edge of the OSC0, and raises the OSC1 to "1" (H-level). When the OSC1 rises to H-level, the output HIT of the NOR gate 108 falls to L-level. For this reason, even if the OSC0 rises to H-level in the next cycle, the SRACT does not rise to H-level.

When the programmable decoder 107 decodes data "01" configured by the outputs OSC1 and OSC2 of the n-bit counter 106, such data corresponds to "1" and does not match with the value "3" corresponding to the CODEj. For this reason, the output DET of the programmable decoder 107 is maintained at L-level, and reset of the n-bit counter 106 is not generated.

As cycles of the OSC0 progresses, and the OSC1 rises to H-level by a falling edge of the OSC0 at a third cycle of the OSC0, the OSC2 at this stage assumes H-level, and therefore data configured by the OSC1 and OSC2 assumes "11". Such data matches with the value of the CODEj. For this reason, the programmable decoder 107 raises the output DET to H-level. When the DET rises to H-level, the n-bit counter 106 is reset, and both of the OSC1 and the OSC2 assume "0" (L-level). When the OSC1 and the OSC2 are reset to L-level, data configured by the OSC1 and the OSC2 no longer matches with the value of the CODEj, and the programmable decoder 107 lowers the output DET to L-level.

When the OSC1 and the OSC2 falls to L-level by the reset of the n-bit counter 106, the output HIT of the NOR gate 108 rises to H-level. For this reason, when the OSC0 rises to H-level at a fourth cycle of the OSC0, the output SRACT of the AND gate 109 rises to H-level, and the RASB signal falls to L-level. Since the SRACT periodically rises to H-level in this manner, the self refreshing is carried out periodically. Operation after the RASB signal assumes L-level is similar to that of the OSC0 at a first cycle. When the OSC0 falls to L-level, the SRACT falls to L-level, and the RASB signal rises to H-level.

In the above description, in order to simplify the description, an example is presented where the CODEj is set to "11" and the refresh period during the self refreshing is triple the oscillating period of the oscillator 102. However, it is sufficient that the value of the CODEj of the ROM circuit 104 which determines the refresh period be properly set corresponding to the oscillating period of the oscillator 102 and the refresh period desired as a target. Hereinafter, description will be made by using a specific example of numerical values.

For example, in a product of Hold 64 ms, 4 KREF, the target of the period of the self refreshing is set to 64 ms/4096=15.625 µs. The tRAS period during the self refreshing is assumed at 40 ns and the oscillating period of the oscillator 102 is assumed at 80 ns. The oscillating period of this oscillator 102 is defined by the CODEi output from the ROM circuit 103. A counter of 9 bits is used for the n-bit counter 106, and the number of bits of the CODEj is assumed at 9 bits.

When the value of each bit of the CODEj is assumed at dec<s> (s: 1 to 9), the refresh period during the self refreshing can be expressed by the following formula:

80 ns×(28×dec<9>+27×dec<8>+26×dec<7>+25× dec<6>+24×dec<5>+23×dec<4>+22×dec<3>+ 21×dec<2>+20×dec<1>)

For example, by setting CODEj<9:1> to "011000011", the refresh period can be set to 15.6 µs. Resolution at this stage is 80 ns (0.08 µs), which is the oscillating period of the oscillator 102. In addition, the maximum period of the refresh period is 40.88 µs, and this refresh period is equivalent to Hold 167 ms.

Figure 3:
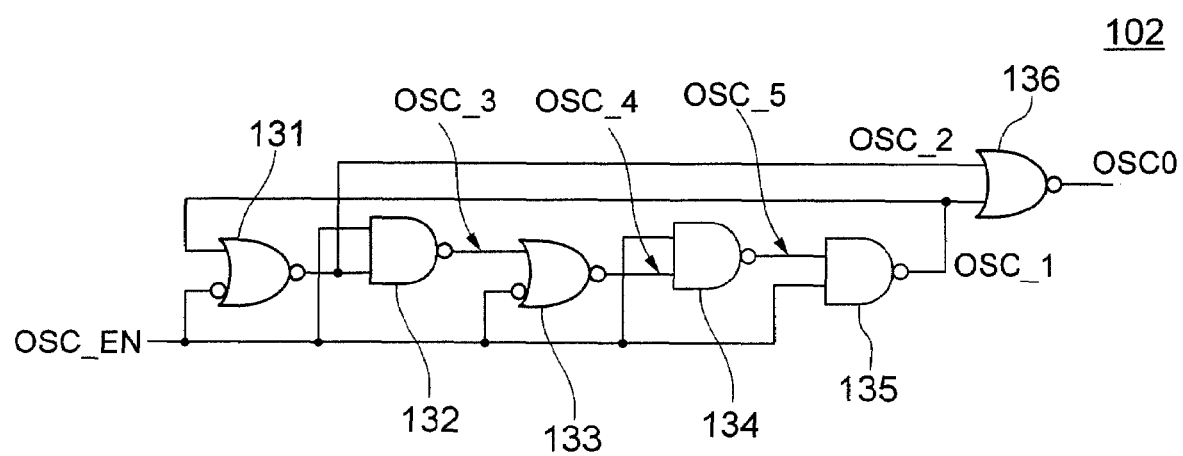
FIG. 3 is a circuit diagram showing the circuit configuration of the oscillator.

As another example of numerical values, description will be made with respect to a case where the oscillating period of the oscillator 102 is assumed at 400 ns and the tRAS period during the self refreshing is assumed at 40 ns. This is equivalent to p=10. FIG. 3 shows the circuit configuration of the oscillator 102. In this example, a ring oscillator is configured by combining three NOR gates 131, 133, and 136, and three NAND gates 132, 134, and 135. The oscillator 102 outputs the OSC0 from the NOR gate 136. A period of the output OSC0 of the oscillator 102 is adjusted to be 400 ns by the CODEi output from the ROM circuit 103.

Figure 4:
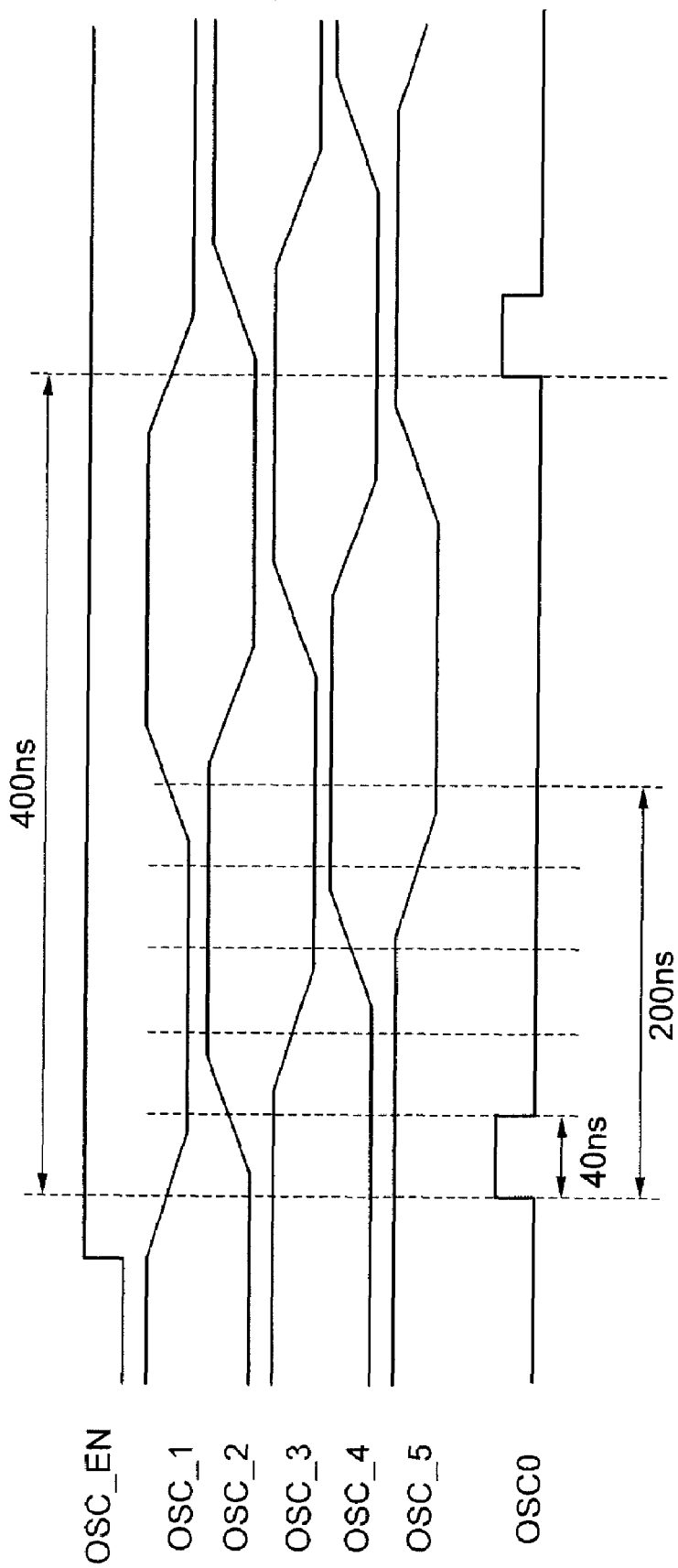
FIG. 4 is a timing chart showing the waveform of each part of the oscillator shown in FIG. 3.

FIG. 4 shows an operational waveform of each part of the oscillator 102 shown in FIG. 3. It is assumed that the output of the NAND gate 135 is OSC_1, the output of the NOR gate 131 is OSC_2, the output of the NAND gate 132 is OSC_3, the output of the NOR gate 133 is OSC_4, and the output of the NAND gate 134 is OSC_5. In an initial state, the OSC_1, OSC_3, and OSC_5 are H-level, and the OSC0, OSC_2, and OSC_4 are L-level. When OSC_EN is changed to H-level and the oscillator 102 is activated, the OSC_1 falls to L-level, and then the OSC_2 rises to H-level, the OSC_3 falls to L-level, the OSC_4 rises to H-level, and the OSC_5 falls to L-level.

When the OSC_5 falls to L-level, the OSC_1 rises to H-level, and thereafter the OSC_2, OSC_3, OSC_4, and OSC_5 change their levels sequentially in this order. An interval of the level changes of the OSC_1 to OSC_5 is 400 ns/2=200 ns, and a time difference of the level change in each stage is 200 ns/5=40 ns. In the oscillator 102 shown in FIG. 3, the output OSC0 assumes H-level only for the time difference (40 ns) between when the OSC_1 falls to L-level and when the OSC_2 rises to H-level. That is, the duty ratio of the OSC0 output from the oscillator 102 is 10%. An H-level period of the OSC0 corresponds to the tRAS period during the self refreshing. By using such an oscillator, the tRAS period 40 ns during the self refreshing can be obtained.

The number of bits of the n-bit counter 106 and the number of bits of the CODEj output from the ROM circuit 104 are assumed at 7 bits. In the oscillator of the above configuration, when a value of each bit of the CODEj is assumed at dec<s> (s: 1 to 7), the refresh period during the self refreshing can be expressed by the following formula:

400 ns×(26×dec<7>+25×dec<6>+24×dec<5>+23× dec<4>+22×dec<3>+21×dec<2>+20×dec<1>)

When CODEj is set to "0100111", the refresh period is 15.6 μs. In this example, resolution of the refresh period is 400 ns and a maximum period thereof is 50.8 μs.

In the present embodiment, an oscillating period of the oscillator 102 for generating the refresh period is set to p times the tRAS period of the self refreshing, and the period of the self refreshing is set to q times the oscillating period of the oscillator 102. By specifying the tRAS period of the self refreshing with use of such an oscillator 102, the self refreshing can be achieved by using a tRAS period different from the tRAS period during the external access including the auto refreshing. In addition, by making the tRAS period during the self refreshing longer than that during the auto refreshing, a restoring level can be secured in the self refreshing in which speed is not considered important.

In the present embodiment, the oscillating period of the oscillator 102 is configured so as to be adjustable based on the output CODEi of the ROM circuit 103, and the circuit is configured so that the oscillating period of the oscillator 102 is p times the tRAS period during the self refreshing. In this manner, even when there is a variation in the oscillating period of the oscillator 102 under the influence of a process fluctuation, the oscillating period of the oscillator 102 can accurately be set to a desired period by the output CODEi of the ROM circuit 103, whereby the tRAS period during the self refreshing can be accurately controlled.

Figure 9:
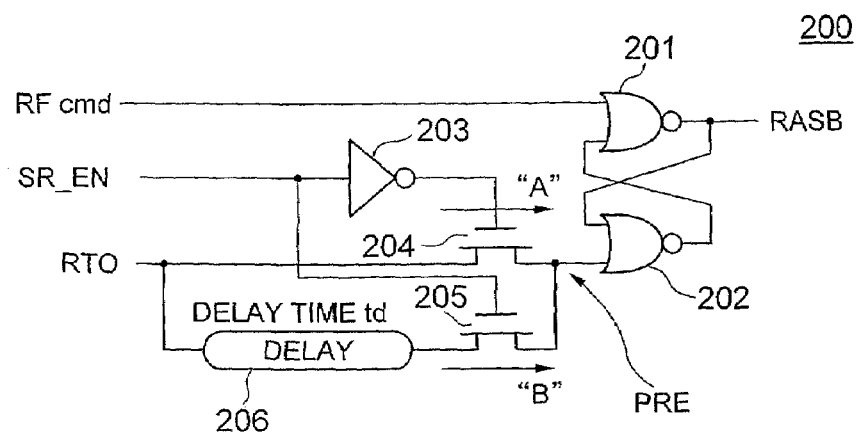
FIG. 9 is a circuit block diagram showing the circuit configuration of a section for generating the RASB signal in the semiconductor memory device described in JP-2001-283586-A.

In the present embodiment, the SR_EN signal, which is an enable signal of the self refreshing, only needs to be input to the oscillator 102 and the n-bit counter 106, and the SR_EN signal need not be provided in the vicinity of the memory cell. It is to be noted in the conventional circuit configuration shown in FIG. 9 that the SR_EN signal should be delivered to each bank, and the delay gate 206 for delaying the RTO should be allocated to each bank. However, in the present embodiment, the circuit section for generating the SRACT signal can be commonly used for each bank, and thus the circuit scale and the number of interconnections can be reduced.

Figure 5:
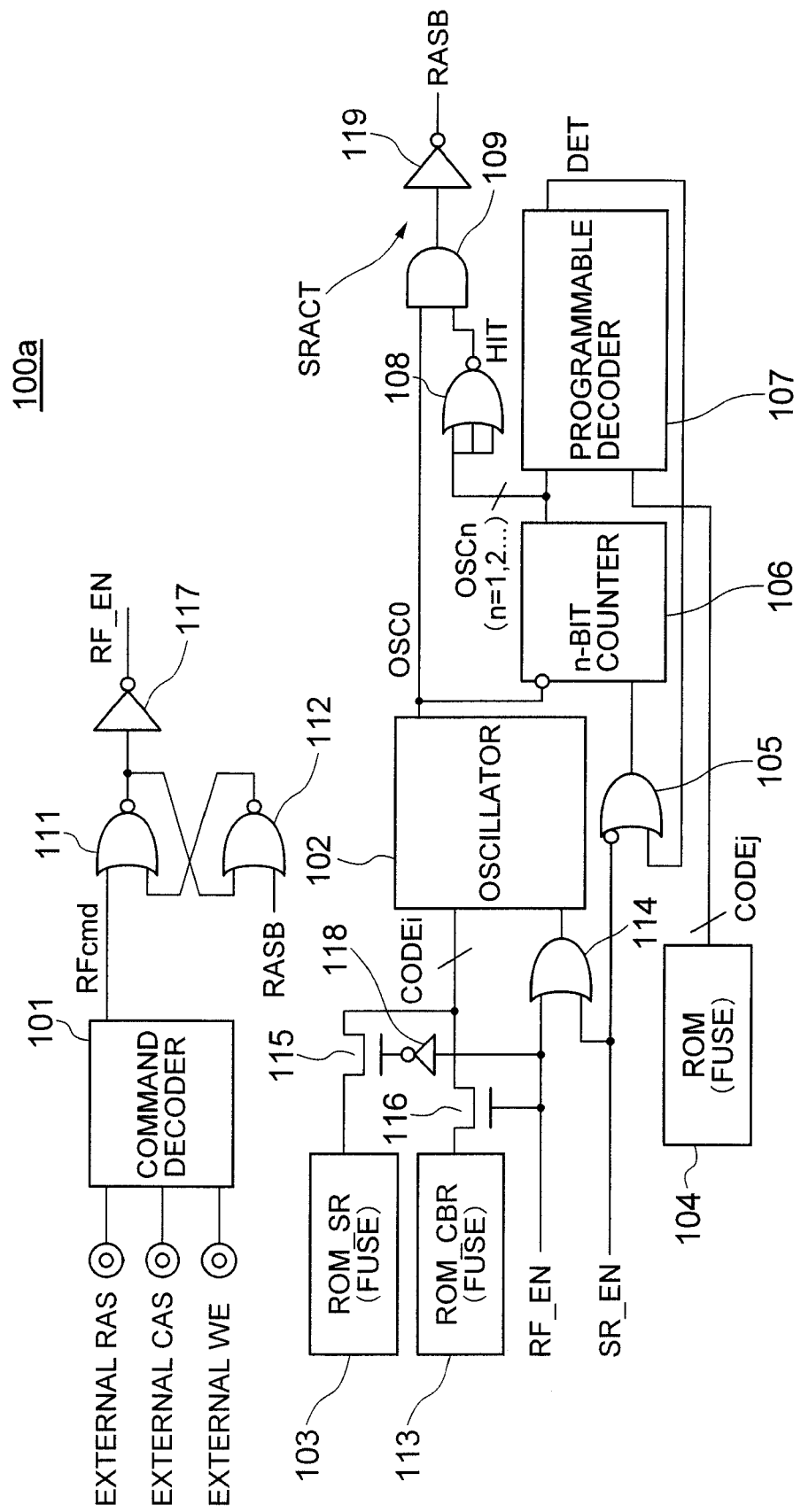
FIG. 5 is a circuit block diagram showing the configuration of the RASB control circuit in the semiconductor memory device according to a second embodiment of the present invention.

FIG. 5 shows the configuration of the RASB control circuit provided in a semiconductor memory device according to a second embodiment of the present invention. The RASB control circuit 100a according to the present embodiment includes the ROM circuit 113 that determines the oscillation frequency of the oscillator 102 during the auto refreshing in addition to the configuration shown in FIG. 1. In the first embodiment, the tRAS period during the auto refreshing is specified by using the delay time of the delay gate 212 (FIG. 10). In the present embodiment, the tRAS period during the auto refreshing is also specified based on the output OSC0 of the oscillator 102.

In the present embodiment, the ROM circuit 113 is used in addition to the ROM circuit 103, and the codes to be input to the oscillator 102 are switched between the self refreshing and the auto refreshing. The ROM circuit 113 is used for adjusting the oscillating period of the oscillator 102 during the auto refreshing. The ROM circuit 113 is configured as a FUSE circuit and includes fuses in number corresponding to the number of bits of the CODEi to be output, similarly to the ROM circuit 103. The oscillating period of the oscillator 102 after manufacture of the semiconductor memory device, for example, during a wafer test, is observed, and the CODEi output from the ROM circuit 113 is adjusted to a code by which the oscillating period of the oscillator 102 equals to p times the designed value of the tRAS period during the auto refreshing.

The command decoder 101 outputs a one-shot pulse in the RF_cmd when a command indicating the auto refreshing is input. The RF_cmd generated by the command decoder 101 is input to a set-reset flip-flop configured by the NOR gates 111 and 112. An output (output of the NOR gate 111) of the flip-flop which is inverted by an inverter 117 is used as the RF_EN. The RASB signal is input to the NOR gate 112, and is used as a reset signal of the RF_EN. That is, the RF_EN signal rises to H-level upon generation of a refresh command during the auto refreshing, and falls to L-level after deactivation of the RASB signal.

The oscillator 102 is connected to the ROM circuit 103 via a transistor 115, and connected to the ROM circuit 113 via a transistor 116. The signal obtained by inverting the RF_EN signal by an inverter 118 is input to the gate of the transistor 115, and the RF_EN signal is input to the gate of the transistor 116. The transistors 115 and 116 are controlled so that one of the transistors 115 and 116 is turned ON corresponding to the signal level of the RF_EN. The oscillator 102 receives OR of the RF_EN and the SR_EN output from an OR gate 114, and carries out oscillating operation when the output of the OR gate 114 assumes H-level. The oscillator 102 oscillates at an oscillating period corresponding to the output code of the ROM circuit 113 input via the transistor 116 when the RF_EN signal assumes H-level, and oscillates at an oscillating period corresponding to the output code of the ROM circuit 103 input via the transistor 115 when the RF_EN signal assumes L-level and the SR_EN signal assumes H-level.

Figure 6:
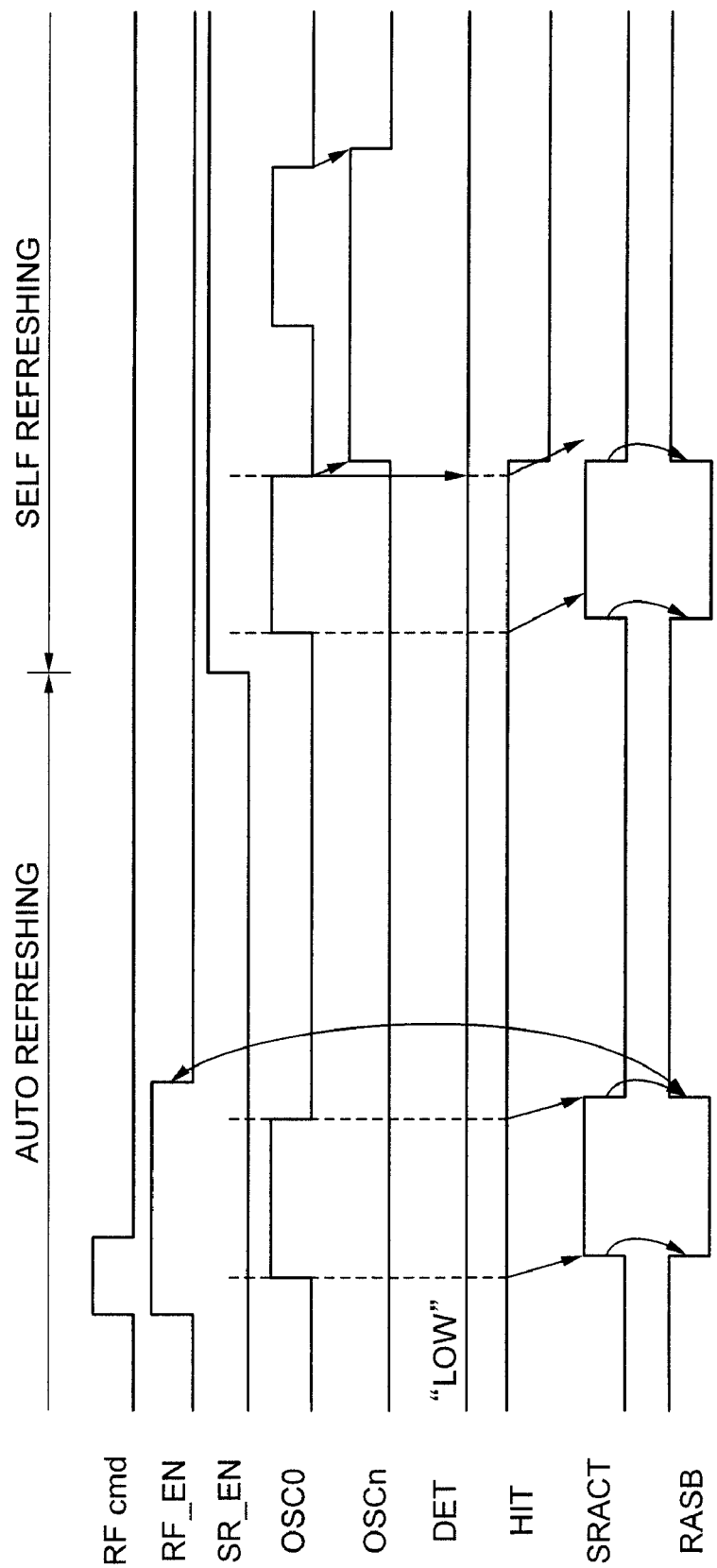
FIG. 6 is a timing chart showing the waveform of each part of the RASB control circuit shown in FIG. 5.

FIG. 6 shows the waveform of each part of the RASB control circuit 100a shown in FIG. 5. This example is equivalent to p=2. Firstly, operation during the auto refreshing will be described. During the auto refreshing, the SR_EN signal is controlled at L-level. When a refresh command (RF_cmd) is input from the command decoder 101 to the NOR gate 111, the output of the NOR gate 111 falls to L-level, and the RF_EN signal rises to H-level. As the RF_EN signal rises to H-level, the oscillator 102 starts operation. At this stage, the transistor 115 is turned OFF and the transistor 116 is turned ON, and the oscillator 102 reads out the code output from the ROM circuit 113 via the transistor 116 which is turned ON, and oscillates at an oscillating period corresponding to the readout code, that is, a period which is p times the tRAS period during the auto refreshing.

After the oscillator starts operation, the output OSC0 of the oscillator 102 rises to H-level. At this stage, the SR_EN signal is controlled at L-level, therefore the n-bit counter 106 is suspended, and the OSC1 to OSCn are at L-level. Accordingly, the output HIT of the NOR gate 108 assumes H-level, and the output SRACT of the AND gate 109 rises to H-level in accordance with the OSC0. In the RASB control circuit 100a, the output SRACT of the AND gate 109 being inverted by an inverter 119 is used as the RASB signal, and the RASB signal falls to L-level after the OSC0 rises to H-level.

The RF_EN signal is maintained at H-level by the flip-flop configured by the NOR gates 111 and 112 after the RASB signal falls. When the OSC0 falls from H-level to L-level, the RASB signal rises from L-level to H-level, and activation of the RASB signal is released. The tRAS period during the auto refreshing is specified by an L-level period of the RASB signal. The L-level period of the RASB signal corresponds to an H-level period of the OSC0 output from the oscillator 102. Therefore, if the duty ratio of the OSC0 is 50% for example, the oscillating period of the oscillator 102 is set to double the desired tRAS period by the CODEi output from the ROM circuit 113, whereby the desired tRAS period can be obtained.

After the RASB signal rises to H-level, one of inputs of the NOR gate 112 rises to H-level, and thereby the flip-flop is reset and the RF_EN falls from H-level to L-level. When the RF_EN signal falls to L-level, the oscillator 102 stops oscillation operation. Thereafter, each time a one-shot pulse is input in the RF_cmd, the oscillator 102 starts oscillation operation similarly to the above operation, and the RASB signal falls to L-level. In addition, when the output OSC0 of the oscillator 102 falls to L-level, the RASB signal rises to H-level and the oscillator 102 is stopped. By repeating such an operation, the auto refreshing based on the external command is executed.

Next, operation during the self refreshing will be described. During the self refreshing, the SR_EN signal is fixed at H-level. In addition, since an external command is not input, the level of the RF_EN signal does not change, and the RF_EN signal is fixed at L-level. Since the RF_EN signal assumes L-level, the transistor 115 is turned ON and the transistor 116 is turned OFF. When the SR_EN signal rises from L-level to H-level during a transition to the self refreshing, the oscillator 102 and the n-bit counter 106 start operation. At this stage, the oscillator 102 reads out the code output from the ROM circuit 103 via the transistor 115 being turned ON, and oscillates at an oscillating period corresponding to the readout code, that is, a period which is p times the tRAS period during the self refreshing.

Operation after the oscillator 102 starts oscillation is similar to that of the first embodiment shown in FIG. 2. That is, when the count of the n-bit counter 106 is "0", the SRACT signal rises to H-level during an H-level period of the output OSC0 of the oscillator 102, and the RASB signal falls to L-level. The tRAS period during the self refreshing is specified by an L-level period of the RASB signal. The L-level period of the RASB signal corresponds to the H-level period of the OSC0 output from the oscillator 102. Therefore, if the duty ratio of the OSC0 is 50%, the oscillating period of the oscillator 102 is set to double the desired tRAS period by the CODEi output from the ROM circuit 103, whereby the desired tRAS period can be obtained.

When the cycle of the output OSC0 of the oscillator 102 progresses, and the counts (OSC1 to OSCn) of the n-bit counter 106 assumes a value corresponding to the CODEj output from the ROM circuit 104, the programmable decoder 107 raises the DET signal to H-level and resets the n-bit counter 106. The output HIT of the NOR gate 108 rises to H-level, as the n-bit counter 106 is being reset, and the SRACT signal rises to H-level during an H-level period of the OSC0 in the succeeding cycle and the RASB signal falls to L-level. By repeating such an operation, the self refreshing is periodically executed.

In the present embodiment, during the auto refreshing, the oscillator 102 oscillates at an oscillating period which is set to p times the tRAS period during the auto refreshing by the CODEi output from the ROM circuit 113, and the RASB signal is activated to L-level based on the OSC0 output from the oscillator 102. In this manner, by determining an activation period (tRAS period) of the RASB signal again by using the oscillator 102 during the auto refreshing, the tRAS period during the auto refreshing can be set to the desired time length accurately as compared with the case where the tRAS period is determined by using a delay gate. Other advantages are similar to those of the first embodiment.

Figure 7:
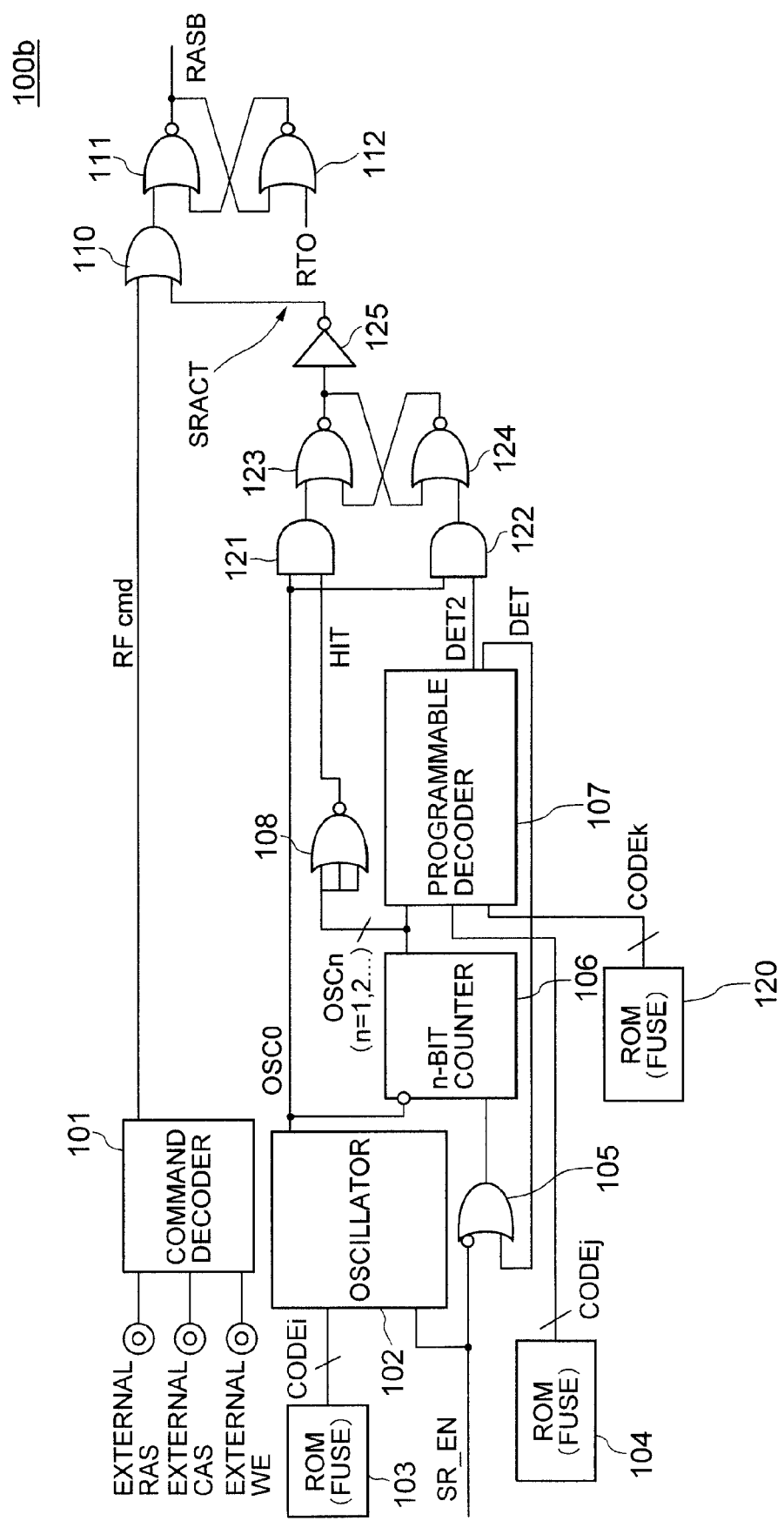
FIG. 7 is a circuit block diagram showing the configuration of the RASB control circuit in the semiconductor memory device according to a third embodiment of the present invention.

FIG. 7 shows the configuration of the RASB control circuit in a semiconductor memory device according to a third embodiment of the present invention. In the present embodiment, the oscillating period of the oscillator 102 during the self refreshing is set to be shorter than the tRAS period in the self refreshing. More specifically, the oscillating period of the oscillator 102 is set to a multiple of 1/r (r: positive integer, p is a reciprocal of the positive integer where p=1/r) of the design value of the tRAS period in the self refreshing, and the oscillating period multiplied by 1/p, that is, the oscillating period multiplied by r, is used as the tRAS period during the self refreshing. In addition, the RASB control circuit 100b in the present embodiment additionally includes a ROM circuit 120 for determining how many cycles of the oscillating period are used for the tRAS period.

When the oscillating period of the oscillator 102 is 1/r times the tRAS period in the self refreshing, the RASB signal only needs to be activated for a period of r cycles of the OSC0 output from the oscillator 102. The ROM circuit 120 outputs CODEk corresponding to a value of r, and the programmable decoder 107 compares the outputs OSC1 to OSCn of the n-bit counter 106 and the CODEk output from the ROM circuit 120. When the outputs OSC1 to OSCn and the CODEk match with each other, the decoder 107 outputs a matching signal DET2 showing the matching.

As described in the first embodiment, the programmable decoder 107 also has a function of issuing the reset output DET to the n-bit counter 106 when the outputs OSC1 to OSCn of the n-bit counter 106 and the CODEj output from the ROM circuit 104 match with each other. That is, the programmable decoder 107 is configured to act as a reset-condition determining circuit that generates reset when the count assumes a value corresponding to q, and also as a matching determination circuit that detects the count of the n-bit counter 106 assumes a predetermined value corresponding to r. With respect to the relationship between r and q, the tRAS period in the self refreshing needs to be shorter than the self refreshing period, and therefore q>r is obtained.

Figure 8:
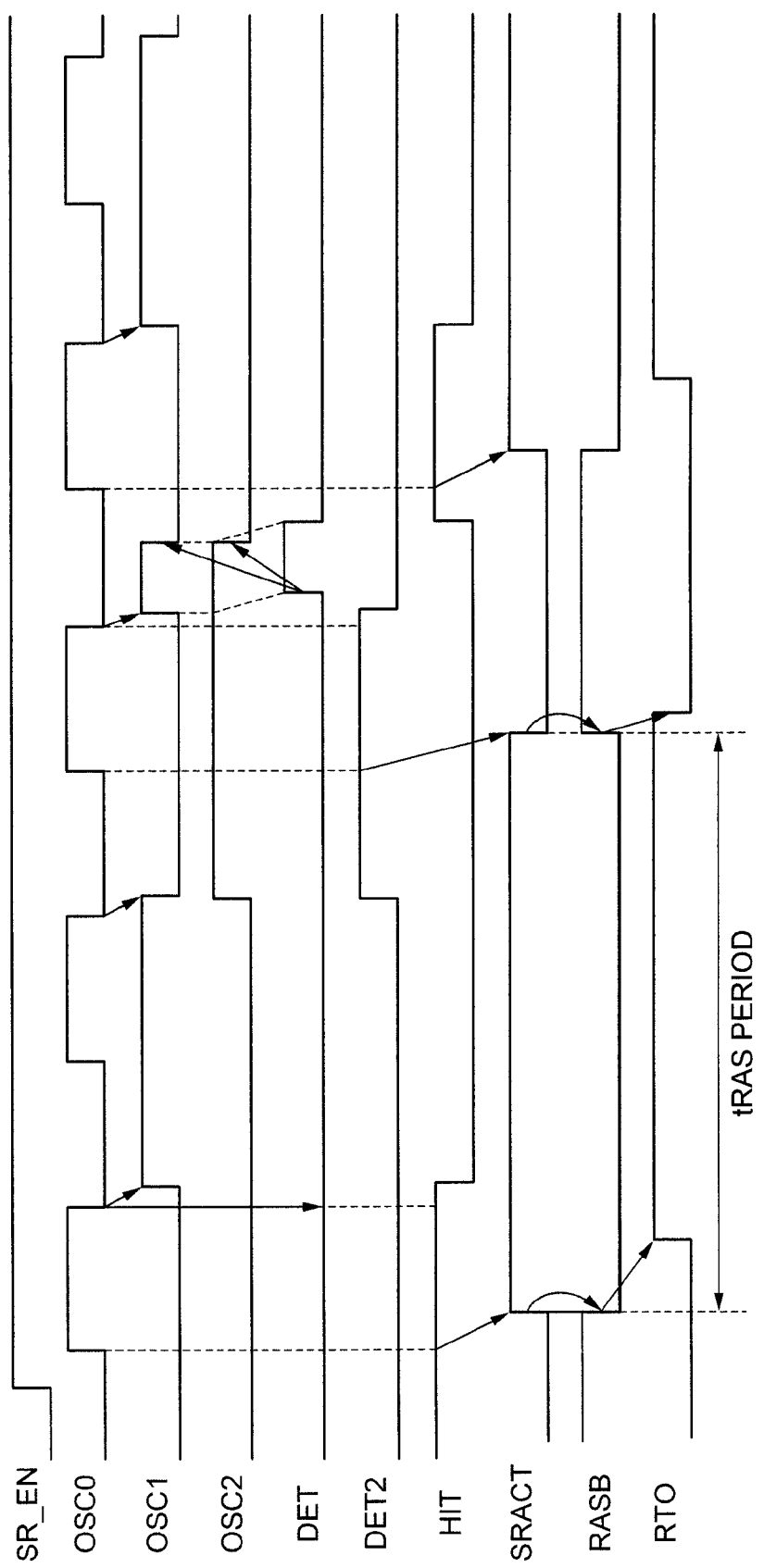
FIG. 8 is a timing chart showing the waveform of each part of the RASB control circuit shown in FIG. 7.

FIG. 8 shows the waveform of each part of the RASB control circuit 100b shown in FIG. 7. Here, the number of bits of the n-bit counter 106 is assumed at 2 bits, and the CODEj output from the ROM circuit 104 is assumed at "11" similarly to the case in FIG. 2 described in the first embodiment. That is, q=3. In addition, the CODEk output from the ROM circuit 102 is "10". That is, r=2 (p=1/2). In this case, since two cycles of the oscillating period of the oscillator 102 are used as the tRAS period, the oscillating period of the oscillator 102 is adjusted to ½ times the tRAS period during the self refreshing. That is, the CODEi output from the ROM circuit 103 is adjusted to a code that makes the oscillating period of the oscillator 102 ½ times the tRAS period during the self refreshing.

When the SR_EN signal rises from L-level to H-level during a transition to the self refreshing, the oscillator 102 starts operation upon a rise of the SR_EN signal from L-level to H-level, and outputs the OSC0 having a period based on the CODEi output from the ROM circuit 103. In addition, since the SR_EN signal rises to H-level, reset of the n-bit counter 106 is released, and the n-bit counter 106 starts counting up.

When the oscillator 102 stars oscillation and the output OSC0 rises to H-level, both inputs of the AND gate 121 rise to H-level since the output HIT of the NOR gate 108 assumes H-level, and the output of the AND gate 121 rises to H-level. The output of the AND gate 121 is input to a set-reset flip-flop configured by NOR gates 123 and 124. Since the output of the AND gate 121 rises to H-level, the output of the NOR gate 123 falls to L-level, and the SRACT signal obtained by inverting the output of the NOR gate 123 by an inverter 125 rises to H-level. The operation from the SRACT signal rising to H-level to the RASB signal falling to L-level is similar to that of the first embodiment.

When the output OSC0 of the oscillator 102 falls to L-level, the output of the AND gate 121 falls to L-level. At this stage, one of inputs of the NOR gate 123 is maintained at H-level by the NOR gate 124, and therefore the output of the NOR gate 123 remains at L-level and the SRACT signal keeps H-level. The n-bit counter 106 changes a count to "01" by the fall of the OSC0. The count does not match with either the CODEj (11) output from the ROM circuit 104 or the CODEk (10) output from the ROM circuit 120, therefore the outputs DET and DET2 of the programmable decoder 107 do not change.

When the OSC0 falls from H-level to L-level at a second cycle of the output OSC0 of the oscillator 102, the output of the n-bit counter 106 assumes "10". The programmable decoder 107 detects that the count of the n-bit counter 106 and the CODEk output from the ROM circuit 120 match with each other, and raises the output DET2 to H-level. The DET2 is input to one of two inputs of the AND gate 122, and when the OSC0 which is the other input rises to H-level in the next cycle, the AND gate 122 raises the output to H-level.

When the output of the AND gate 122 rises to H-level, the output of the NOR gate 124 falls to L-level, and the set-reset flip-flop is reset. In this manner, the output of the NOR gate 123 rises to H-level, and the SRACT falls to L-level. When the SRACT falls to L-level, the output of the OR gate 110 falls to L-level, the output of the NOR gate 111 rises to H-level, and the RASB signal is deactivated. The activated period of the RASB signal is specified by a period from the oscillator 102 raising the output OSC0 to H-level to a rising edge of the OSC0 in the cycle immediately after the programmable decoder 107 raises the DET2 to H-level, and is equivalent to two cycles of the oscillating period of the oscillator 102.

Thereafter, when the OSC0 falls from H-level to L-level in a third cycle of the output OSC0 of the oscillator 102, the count of the n-bit counter 106 assumes "11". This value matches with the CODEj output from the ROM circuit 104, and therefore the programmable decoder 107 raises the DET signal to H-level and resets the n-bit counter 106. In this manner, the SRACT signal rises to H-level again at the rising edge of the next cycle of the OSC0, whereby the RASB signal is activated. This operation is similar to that of the first embodiment.

In the present embodiment, the oscillating period of the oscillator 102 is set to a reciprocal of integer (a multiple of 1/r) of the tRAS period in the self refreshing, and r cycles of the oscillating period of the oscillator 102 are used as the tRAS period in the self refreshing. In the present embodiment, the oscillating period of the oscillator 102 is set shorter than the tRAS period in the self refreshing. In such a case, the tRAS period only needs to be set by a period of a plurality of cycles of the OSC0 output from the oscillator 102, more specifically, a period of r cycles. Other advantages are similar to those in the first embodiment.

In the first and the second embodiments, the tRAS period is set by using the H-level period of the OSC0 output from the oscillator 102. However, the present invention is not limited thereto. It is possible to adopt the configuration in which the tRAS period is set by using an L-level period of the OSC0 after the signal level in the RASB control circuit is properly replaced.

In the second embodiment, during the auto refreshing, the oscillating period of the oscillator 102 is set to p times the tRAS period during the auto refreshing, and during the self refreshing, the oscillating period of the oscillator 102 is set to p times the tRAS period during the self refreshing. Then, the oscillating period multiplied by 1/p is used as the tRAS period in both the refresh operations. However, magnifying powers of the oscillating period of the oscillator 102 in the auto refreshing and in the self refreshing with respect to the tRAS period do not need to be the same, and different magnifying powers may be set for a first refreshing and a second refreshing. For example, it is possible to adopt the configuration in which the duty ratio of a periodic signal output from the oscillator 102 is set to be variable during the auto refreshing and the self refreshing, and the oscillating period of the oscillator 102 during the auto refreshing is set to s times (s: positive integer) as long as the tRAS period, and, in the auto refreshing, the oscillating period multiplied by 1/s is used as the tRAS period during the auto refreshing.

In the third embodiment, description has been made with respect to an example where the programmable decoder 107 acts as a reset-condition determination circuit that issues a reset based on the CODEj output from the ROM circuit 104, and also as a matching determination circuit for determining whether or not the OSC0 has progressed for a desired number of cycles, based on the CODEk output from the ROM circuit 120. However, the present invention is not limited thereto. The reset-condition determination circuit and the matching determination circuit may be configured by separate programmable decoders.

In addition, also in the third embodiment in which the oscillating period is made shorter than the tRAS period, the tRAS period during the auto refreshing can be specified by using the oscillating period of the oscillator 102 in a manner similar to that in the second embodiment. In this case, an activation period of a cell array in each refreshing is determined by a product of the oscillating period of the oscillator 102 in each refreshing and the number of cycles up to the cycle when the programmable decoder 107 generates the DET2. Therefore, only at least one of the oscillating period of the oscillator 102 and the number of cycles up to the generation of the DET2 needs to be changed corresponding to types of the refresh operation.

For example, the oscillating period of the oscillator 102 may be set to the same period for the auto refreshing and the self refreshing, and the number of cycles up to the cycle when the programmable decoder 107 generates the DET2 may be different between the auto refreshing and the self refreshing. More specifically, the oscillating period multiplied by t (t: positive integer) is the tRAS period in the auto refreshing, and the oscillating period multiplied by r (r: positive integer) is the tRAS period in the self refreshing. The oscillating period of the oscillator 102 in this case is equal to the tRAS period multiplied by 1/t during the auto refreshing, or the tRAS period multiplied by 1/r during the self refreshing. The above operation is achieved by providing a ROM circuit that outputs a code corresponding to t, in addition to the configuration shown in FIG. 7, and during the auto refreshing, by delivering the output code of the ROM circuit to the programmable decoder 107 and detecting t cycles of the oscillating period at the programmable decoder 107.

Alternatively, the oscillating period of the oscillator 102 is set to different periods in the auto refreshing and the self refreshing, and the number of cycles up to the cycle when the programmable decoder 107 generates the DET2 can be set to the same number of cycles in the first refreshing and the second refreshing. More specifically, the oscillating period of the oscillator 102 during the auto refreshing is set to a period equal to p times the tRAS period in the auto refreshing, and the oscillating period of the oscillator 102 during the self refreshing is set to another period equal to p times the tRAS period in the self refreshing. Then, the oscillating period of the oscillator 102 multiplied by 1/p (=multiplied by r) is used as the tRAS period in both the auto refreshing and the self refreshing. Such operation can be achieved by providing a ROM circuit equivalent to the ROM circuit 113 in FIG. 5 to the configuration shown in FIG. 7, and by switching the codes to be input to the oscillator 102 between the auto refreshing and the self refreshing to change the oscillating period.

Further, while the oscillating period of the oscillator 102 is set to be different between the auto refreshing and the self refreshing, the number of cycles up to the cycle when the programmable decoder 107 generates the DET2 may be different between the first refreshing and the second refreshing. More specifically, the oscillating period of the oscillator 102 during the auto refreshing is equal to 1/t times (t: positive integer, and s is assumed at a reciprocal of the positive integer to obtain s=1/t) as long as the tRAS period in the auto refreshing, and the oscillating period of the oscillator during the self refreshing is assumed at 1/r times (r: positive integer: r=1/p) as long as the tRAS period in the self refreshing, and during the auto refreshing, the oscillating period multiplied by t is used as the tRAS period, and during the self refreshing, the oscillating period multiplied by r is used as the tRAS period. Such operation can be achieved by providing a ROM circuit equivalent to the ROM circuit 113 in FIG. 5 and a ROM circuit (equivalent to the ROM circuit 120) that outputs a code corresponding to t to the configuration shown in FIG. 7, and by switching the code input to the oscillator 102 and the code input to the programmable decoder 107 between the auto refreshing and the self refreshing.

As described heretofore, in the semiconductor memory device according to the embodiments of the present invention, it is possible to set the tRAS period during the first refreshing and the tRAS period in the second refreshing to different periods independently of each other, whereby an optimum period can be determined for each of the first refreshing and second refreshing depending the type of the refreshing. In addition, even if the semiconductor memory device includes a plurality of memory banks, the signal interconnection for differentiating the types of the refreshing is not need for each of the memory banks, whereby the number of interconnections e can be reduced. Further, a delay gate for setting the tRAS period to different periods in order to differentiate the first refreshing from the second refreshing is not needed, whereby the circuit scale of the semiconductor memory device can be reduced.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor memory device that executes a first refreshing executed in accordance with an external command and a second refreshing executed periodically in a timing generated in said semiconductor memory device, comprising:
   an oscillator that oscillates at an oscillating period which is p times (p: a positive integer or a reciprocal of a positive integer) as long as an activated period (referred to as tRAS period hereinafter) of a cell array for access in said second refreshing, and outputs a periodic signal including a plurality of cycles of said oscillating period, wherein:
   said second refreshing is executed by activating said cell array for a period equal to 1/p times a first period specified by a number of cycles in said periodic signal, and a period equal to said first period multiplied by q (q: a positive integer) is selected as a refresh period of said second refreshing; and
   a counter for counting a number of cycles in said periodic signal; and a reset generation unit that outputs a reset signal to said counter when a count of said counter is equal to a value corresponding to said q, wherein and said second refreshing is executed each time said reset generation unit generates a reset.

2. The semiconductor memory device according to claim 1, wherein said tRAS period in said second refreshing is longer than said tRAS period in said first refreshing.

3. The semiconductor memory device according to claim 1, wherein said reset generation unit comprises: a first ROM circuit that outputs a predetermined code; and a reset-condition determination circuit that compares an output code of said first ROM circuit and said count of said counter to generate a reset signal when said output code and said count match with each other, and wherein said output code of said first ROM circuit is adjusted so that a refresh period of said second refreshing is q times an oscillating period of said oscillator.

4. The semiconductor memory device according to claim 1, wherein said second refreshing is executed when said periodic signal rises to H-level after said count of said counter is reset by said reset generation unit.

5. The semiconductor memory device according to claim 4, wherein said oscillating period of said oscillator during said second refreshing is set to be longer than said tRAS period in said second refreshing, and an H-level period in one cycle of said periodic signal during said second refreshing and said tRAS period in said second refreshing match with each other, and wherein said second refreshing is executed by setting said H-level period of said periodic signal in a cycle immediately after said count of said counter is reset as said activated period of said cell array.

6. The semiconductor memory device according to claim 5, wherein said counter is a n-bit counter (n is an integer equal to 2 or more), and said second refreshing having said H-level period of said periodic signal as said activated period of said cell array is executed in a refresh period equal to q times said oscillating in said periodic signal based on AND between NOR of each bit value of said count output from said counter and said periodic signal.

7. The semiconductor memory device according to claim 1, wherein said oscillating period of said oscillator during said second refreshing is set to 1/r times (r: a positive integer) as long as said tRAS period in said second refreshing, and said second refreshing is executed by setting a period of r cycles in said periodic signal from said start of a cycle immediately after said count of said counter is reset as said activated period of said cell array.

8. The semiconductor memory device according to claim 7, further comprising: a second ROM circuit that outputs a code corresponding to a value of said r; and a matching determination circuit that compares said output of said second ROM circuit and a count of said counter to generate a matching signal when said output of said ROM circuit and said count of said counter match with each other, wherein said second refreshing is executed by setting a period from start of a cycle immediately after generation of said reset signal to generation of said matching signal as said activated period of said cell array.

9. The semiconductor memory device according to claim 1, further comprising a third ROM circuit, wherein said oscillator is configured such that said oscillating period is adjusted corresponding to an input code, and oscillates at an oscillating period corresponding to a code input from said third ROM circuit for determining said oscillating period of said oscillator during said second refreshing, and wherein an output code of said third ROM circuit is adjusted to a code by which said oscillating period of said oscillator assumes a period equal to p times said tRAS period in said second refreshing after said semiconductor memory device is manufactured.

10. The semiconductor memory device according to claim 1, further comprising: a set-reset flip-flop that activates an RASB signal for activating said cell array when a command for executing said first refreshing is input; and
an RTO generation circuit that generates an RTO signal for resetting said flip-flop after a lapse of said tRAS period in said first refreshing after said RASB signal is activated.

11. The semiconductor memory device according to claim 1, wherein said oscillator starts oscillation at an oscillating period equal to s times (s: a positive integer or a reciprocal of a positive integer) as long as said tRAS period in said first refreshing when a command for executing said first refreshing is input to said semiconductor memory device, and wherein said first refreshing is executed by activating said cell array for a period equal to 1/s times said oscillating period in said periodic signal.

12. The semiconductor memory device according to claim 11, wherein said oscillating period of said oscillator during said first refreshing is set to be longer than said tRAS period in said first refreshing, and an H-level period in one cycle of said periodic signal during said first refreshing is set to said tRAS period in said first refreshing, and wherein an inverted signal of said periodic signal is used as said RASB signal for activating said cell array in said first refreshing.

13. The semiconductor memory device according to claim 8, wherein said oscillator starts oscillation at an oscillating period equal to s times (s: a positive integer or a fraction of a positive integer) as long as said tRAS period in said first refreshing when a command for executing said first refreshing is input to said semiconductor memory device, and wherein said first refreshing is executed by activating said cell array for a period equal to 1/s times said oscillating period in said periodic signal output from said oscillator.

14. The semiconductor memory device according to claim 13, wherein said oscillating period of said oscillator during said first refreshing is set to 1/t times said tRAS period in said first refreshing, and said first refreshing is executed by setting a period of t cycles in said periodic signal from said start of counting of said counter as an activated period of said cell array.

15. The semiconductor memory device according to claim 14, further comprising a fourth ROM circuit that outputs a code corresponding to a value of said t, wherein said matching determination circuit compares said output of said fourth ROM circuit and a count of said counter during said first refreshing, to generate a matching signal when said output of said fourth ROM and said count match with each other, and wherein said first refreshing is executed by setting a period from said start of said oscillation of said oscillator to said generation of said matching signal as said activated period of said cell array.

16. The semiconductor memory device according to claim 15, wherein a code output from said fourth ROM circuit is input to said matching determination circuit during said first refreshing; and a code output from said second ROM circuit is input to said matching determination circuit during said second refreshing.

17. The semiconductor memory device according to claim 9, wherein said oscillator starts oscillation at an oscillating period equal to s times (s: a positive integer or a reciprocal of a positive integer) as long as said tRAS period in said first refreshing when a command for executing said first refreshing is input to said semiconductor memory device, and wherein said first refreshing is executed by activating said cell array for a period equal to 1/s times said oscillating period in said periodic signal output from said oscillator.

18. The semiconductor memory device according to claim 17, further comprising a fifth ROM circuit, wherein said oscillator oscillates at an oscillating period corresponding to a code input from said fifth ROM circuit for determining said oscillating period of said oscillator during said first refreshing in said first refreshing, and wherein an output code of said fifth ROM circuit is adjusted to a code by which said oscillating period of said oscillator assumes as period equal to s times said tRAS period in said first refreshing after said semiconductor memory device is manufactured.

19. The semiconductor memory device according to claim 18, wherein a code output from said fifth ROM circuit is input to said oscillator during said first refreshing; and
a code output from said second ROM circuit is input to said oscillator during said second refreshing.

20. The semiconductor memory device according to claim 11, wherein said oscillating period of said oscillator is different between during said first refreshing and during said second refreshing.

21. The semiconductor memory device according to any one of claims 11 to 20, wherein said oscillator stops oscillation after a lapse of a period equal to 1/s times said oscillating period in said periodic signal after said start of said oscillation in said first refreshing.

22. The semiconductor memory device according to claim 8, wherein said oscillator starts oscillation at an oscillating period equal to 1/r times said tRAS period in said second refreshing when a command for executing said first refreshing is input, and wherein said first refreshing is executed by activating said cell array for a period of t (t: a positive integer) cycles of a periodic signal output from said oscillator to set said tRAS period.

23. The semiconductor memory device according to claim 22, further comprising: a fourth ROM circuit that outputs a code corresponding to a value of said t, wherein said matching determination circuit compares said output of said fourth ROM circuit and a count of said counter during said first refreshing, to generate a matching signal when said output and said count match with each other, and wherein said first refreshing is executed by setting a period from said start of said oscillation of said oscillator to said generation of said matching signal as said activated period of said cell array.

24. The semiconductor memory device according to claim 22 or 23, wherein said oscillator stops oscillation after a lapse of a period equal to t times said oscillating period in said periodic signal after said start of said oscillation in said first refreshing.

* * * * *